United States Patent [19]

Duesman

[11] Patent Number: 5,787,044
[45] Date of Patent: Jul. 28, 1998

[54] MEMORY-CELL ARRAY AND A METHOD FOR REPAIRING THE SAME

[75] Inventor: Kevin G. Duesman, Boise, Id.

[73] Assignee: Micron Technology, Inc., Boise, Id.

[21] Appl. No.: 835,867

[22] Filed: Apr. 8, 1997

Related U.S. Application Data

[63] Continuation of Ser. No. 546,674, Oct. 23, 1995, abandoned.

[51] Int. Cl.[6] .................................................. G11C 1/40
[52] U.S. Cl. ........................... 365/200; 365/149; 365/226
[58] Field of Search ................................. 365/200, 149, 365/185.16, 226, 189.06

[56] References Cited

U.S. PATENT DOCUMENTS

| | | | |
|---|---|---|---|
| 5,079,743 | 1/1992 | Suwa | 365/149 |
| 5,079,746 | 1/1992 | Sato | 365/149 |
| 5,235,550 | 8/1993 | Zagar | 365/226 |
| 5,301,143 | 4/1994 | Ohri et al. | 365/96 |
| 5,373,463 | 12/1994 | Jones | 365/149 |
| 5,450,360 | 9/1995 | Sato | 365/200 |
| 5,469,391 | 11/1995 | Haraguchi | 365/200 |

*Primary Examiner*—A. Zarabian
*Attorney, Agent, or Firm*—Seed and Berry LLP

[57] ABSTRACT

An array of memory cells are arranged in rows and columns. The array includes a plurality of cell plates that are each coupled to at least one of the memory cells. A generator produces a bias voltage. A plurality of isolation circuits are each coupled between the generator and one or more of the cell plates. Each isolation circuit provides the bias voltage to the cell plate or plates to which the isolation circuit is coupled. The cell plates may be coupled to memory cells from a plurality of the columns. Additionally, each of the isolation circuits may selectively provide, in response to a control signal, the bias voltage to the cell plate or plates to which the isolation circuit is coupled.

26 Claims, 5 Drawing Sheets

MEMORY-CELL ARRAY AND A METHOD FOR REPAIRING THE SAME

CROSS-REFERENCE TO RELATED APPLICATION

This application is a continuation of U.S. patent application Ser. No. 08/546,674, filed Oct. 23, 1995, now abandoned.

TECHNICAL FIELD

The present invention relates generally to electronic devices, and more specifically to memory-cell arrays having a structure that reduces the risk of an irreparable defect in the array and a method for repairing defective ones of such arrays.

BACKGROUND OF THE INVENTION

As memory devices, such as dynamic random access memories (DRAM), increase in density, it becomes statistically more likely that one or more short circuits will exist, such as between a cell plate and a word, i.e., row, line, a bit, i.e., column, line, or another portion of a memory device. For example, for a 4-megabit DRAM, the probability of having at least one such short circuit ranges between approximately 10%–20%, depending upon the particular manufacturing process used. Causes of such short circuits include particle contamination and process variability. Even memory devices manufactured in the cleanest fabrication facilities and by the most carefully controlled processes are not immune from such yield-reducing short circuits.

FIG. 1 is a schematic block diagram of a memory-cell array 10 of a memory device 12. The array 10 includes a number of substantially identical memory cells 13, which each include an access switch 14 and a storage device 16. As shown here, the access switch is a transistor 14, and the storage device is a capacitor 16. The memory cells 13 are arranged in rows 0–x and columns 0–n; one memory cell 13 is positioned at the intersection of each row and column. As shown, each row includes one row line ROW, and each column includes a pair of complementary column lines COL and $\overline{COL}$. Thus, each memory cell 13 has a control terminal coupled to an associated row line and a data terminal coupled to an associated column line. Each pair of complementary column lines is coupled to a sense amplifier 18, which reads the data stored in an addressed memory cell 13 that is coupled to either of the pair of complementary column lines. The array 10 also includes equilibrate switches 20, each of which is coupled between a different pair of complementary column lines and has a control terminal coupled to an equilibrate line EQ. As shown here, the equilibrate switches are the transistors 20.

Additionally, the memory-cell array 10 includes a cell plate CP, which is typically a plane formed in a conductive layer of the memory device 12 in the vicinity of the array 10 as indicated by the dashed outline. Each memory cell 13 has a reference terminal that is coupled to the cell plate CP. More specifically, as shown, each capacitor 16 has a first plate 22, which is coupled to the associated access transistor 14, and a second plate 24, which is coupled to the cell plate CP. A voltage generator 26 generates from a supply voltage Vcc a reference or bias voltage, which is typically equal or approximately equal to Vcc/2. Typically, Vcc is approximately 5 volts, although in newer memory devices Vcc may be as low as 3.3 volts. The voltage generator 26 drives the cell plate CP with this bias voltage, which, as discussed below, reduces the stresses to which the capacitors 16 are subjected.

Each of the memory cells 13 stores a single bit of data. A voltage of approximately Vcc at the plate 22 indicates a positive voltage (i.e., the plate 22 is more positive than the plate 24) of Vcc/2 across the capacitor 16. This positive voltage corresponds to a first binary data value, typically a 1. Conversely, a voltage of approximately 0 at the plate 22 indicates a negative voltage of −Vcc/2 across the capacitor 16. This negative voltage corresponds to a second binary data value, typically a 0. Thus, a capacitor 16 of a memory cell 13 never has more than |Vcc/2| across it. The reduction in the voltage stresses (as compared with capacitors of prior memory devices that could have voltages of Vcc across them) that are applied to the capacitors 16 greatly increases their operational lifetime.

In operation of the memory device 12, before the cells 13 are read from or written to, control circuitry (not shown in FIG. 1) generates an equilibration signal on the line EQ to equilibrate via the transistors 20 each of the complementary pairs of column lines COL and $\overline{COL}$. That is, the transistor 20 is closed to couple together COL and $\overline{COL}$ of each pair of column lines and to bring COL and $\overline{COL}$ to the same voltage level of approximately Vcc/2. (Typically, before the equilibration interval, one of the lines COL and $\overline{COL}$ of each pair is at a logic 0 or 0 volts, and the other is at a logic 1 or Vcc. By shorting the two lines together, the voltage on the first line rises from 0 to Vcc/2, and the voltage on the second line falls from Vcc to Vcc/2.) During the equilibration interval, the control circuitry drives the row lines $ROW_0$–$ROW_x$ with a voltage substantially equal to 0 volts to deactivate the memory cells 13.

After the equilibration interval, during a read cycle, the control circuitry drives the row line of the addressed memory cell 13 with a voltage approximately equal to Vcc to activate the addressed cell 13. The voltage on the plate 22 of the capacitor 16 is transferred via the transistor 14 to the complementary column line coupled to the addressed cell 13. The associated sense amplifier 18 compares this voltage level to the Vcc/2 on the other complimentary column line, drives the higher column line to Vcc and the lower column line to 0, and provides the data contents of the addressed cell 13 to read/write circuitry (not shown in FIG. 1).

After the equilibration interval, during a write cycle, the control circuitry drives the row line that is coupled to the addressed cell 13 with Vcc, and the read/write circuit drives the column line that is coupled to the addressed cell 13 with a voltage, either Vcc or 0, that corresponds to the value of the data bit to be stored in the addressed cell 13.

A problem may arise when either a row line, a column line, or another line becomes short-circuited to the cell plate CP. For example, if the line to which the cell plate CP is shorted is driven to 0 volts, the cell plate CP will gradually discharge to a voltage lower than Vcc/2. This discharging typically occurs because the voltage generator 20 cannot output enough current to compensate for the current lost via the short circuit. Likewise, if the line to which the cell plate CP is shorted is driven to Vcc, the cell plate CP will gradually charge to a voltage greater than Vcc/2. Either scenario may cause data storage errors, and worse, may generate voltages larger than Vcc/2 across, and thus may destroy, one or more of the capacitors 16. Because there is often no way to repair such a short circuit, the memory device 12 is often irreparably damaged, and must be discarded.

FIG. 2 is a cross-section of the array 10 of FIG. 1 that illustrates in more detail how a short circuit between the cell plate CP and a column line or a row line may occur. As shown, the array 10 includes a column line 24 that is electrically isolated from the cell plate CP by an insulating layer 26. A memory cell 13 includes a transistor 14 that has its source S coupled to the plate 28 of the capacitor 16. The other plate 24 is formed by the cell plate CP. Thus, the cell plate CP in effect forms a common plate for all the capacitors 16. An insulating layer 30 isolates the cell plate CP from the memory cell 13. A conductive via 32, which extends through the cell plate CP and the layers 26 and 30, couples the column line 24 to the drain D of the transistor 14. An insulating layer 34 surrounds the via 32, and thus isolates the via 32 from the cell plate CP. A row line 36, which is coupled to the memory cell 13, also acts as the gate G of the transistor 14.

As shown, if the insulator 34 is defective in the vicinity of the cell plate CP, the via 32 may contact the cell plate CP and thus cause a short circuit between the column line 24 and the cell plate CP. Furthermore, although not shown, a defect in the insulating layer 30 may cause a short circuit between the row line 36 and the cell plate CP. As stated above, even just one such short circuit may render the memory device 12 irreparably damaged.

SUMMARY OF THE INVENTION

In accordance with an aspect of the present invention, an array of memory cells are arranged in rows and columns. The array includes a plurality of cell plates that are each coupled to at least one of the memory cells. A generator produces a bias voltage. A plurality of isolation circuits are each coupled between the generator and at least one of the cell plates. Each isolation circuit provides the bias voltage to the cell plate or plates to which the isolation circuit is coupled. In a related aspect of the invention, each of the cell plates is coupled to memory cells from a plurality of the columns. In another related aspect of the invention, each of the isolation circuits selectively provides, in response to a control signal, the bias voltage to the cell plate or plates to which the isolation circuit is coupled.

An advantage provided by one aspect of the present invention is a structure and method for repairing a memory-cell array in which a portion of the cell plate is short circuited or otherwise defective.

DETAILED DESCRIPTION OF THE INVENTION

Figure 3:
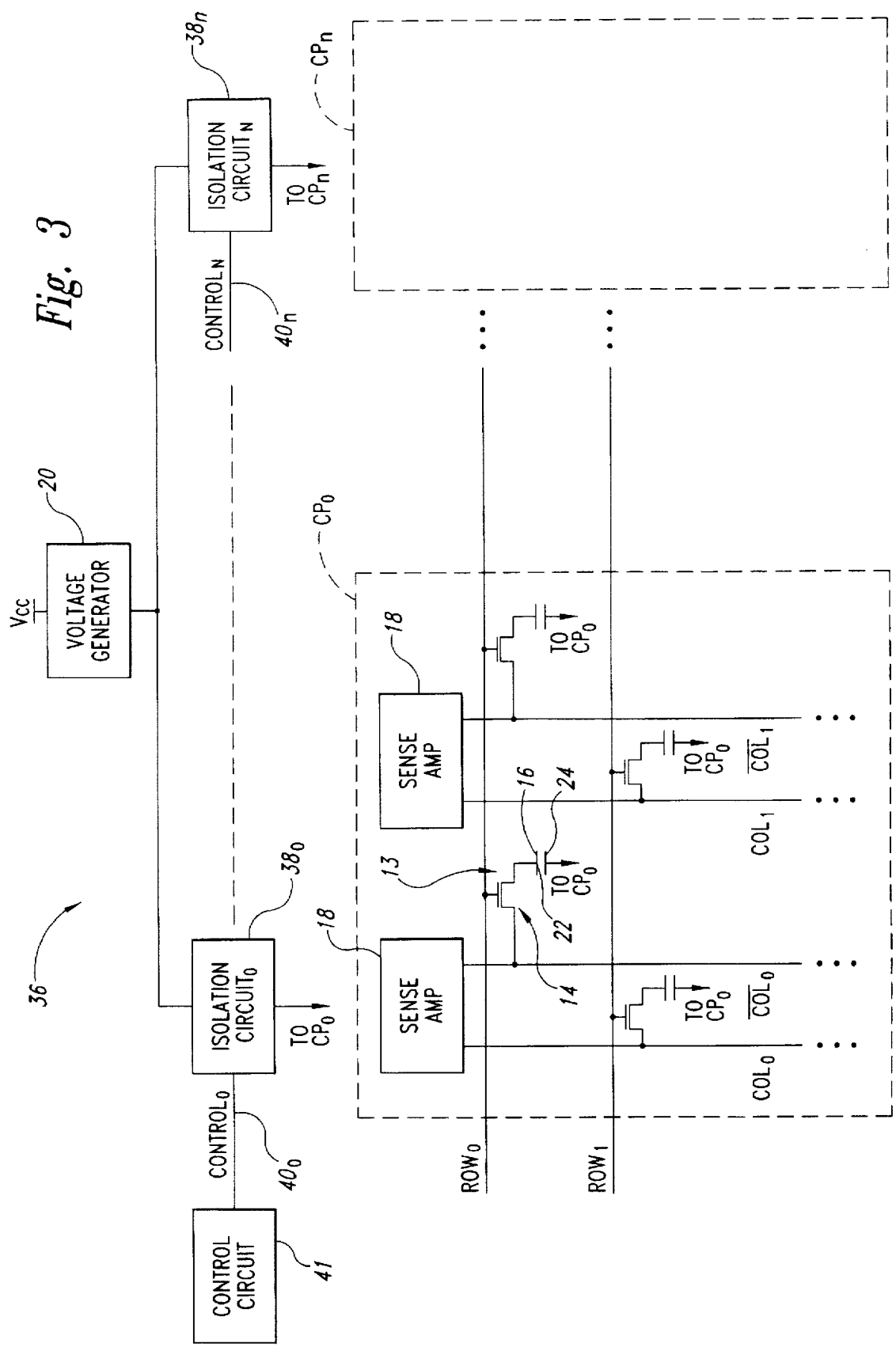
FIG. 3 is a schematic diagram of a memory-cell array in accordance with the present invention.

FIG. 3 is a schematic diagram of a memory-cell array 36 in accordance with the present invention. In many aspects, the array 36 is similar to the array 10 of FIG. 1. For example, the array 36 includes a number of memory cells 13, which are arranged in a plurality of rows and columns as shown. Each of the memory cells 13 includes an access transistor 14 and a storage capacitor 16, which are coupled as shown. A number of sense amplifiers 18 are each coupled to a complementary pair of column lines COL and $\overline{COL}$. A voltage generator 20, which is coupled to the supply voltage Vcc, generates a bias voltage, which in one aspect of the invention is Vcc/2. The array 36 also includes an equilibration line EQ and a number of equilibration transistors 20, which are omitted from FIG. 3 for clarity.

Figure 1:
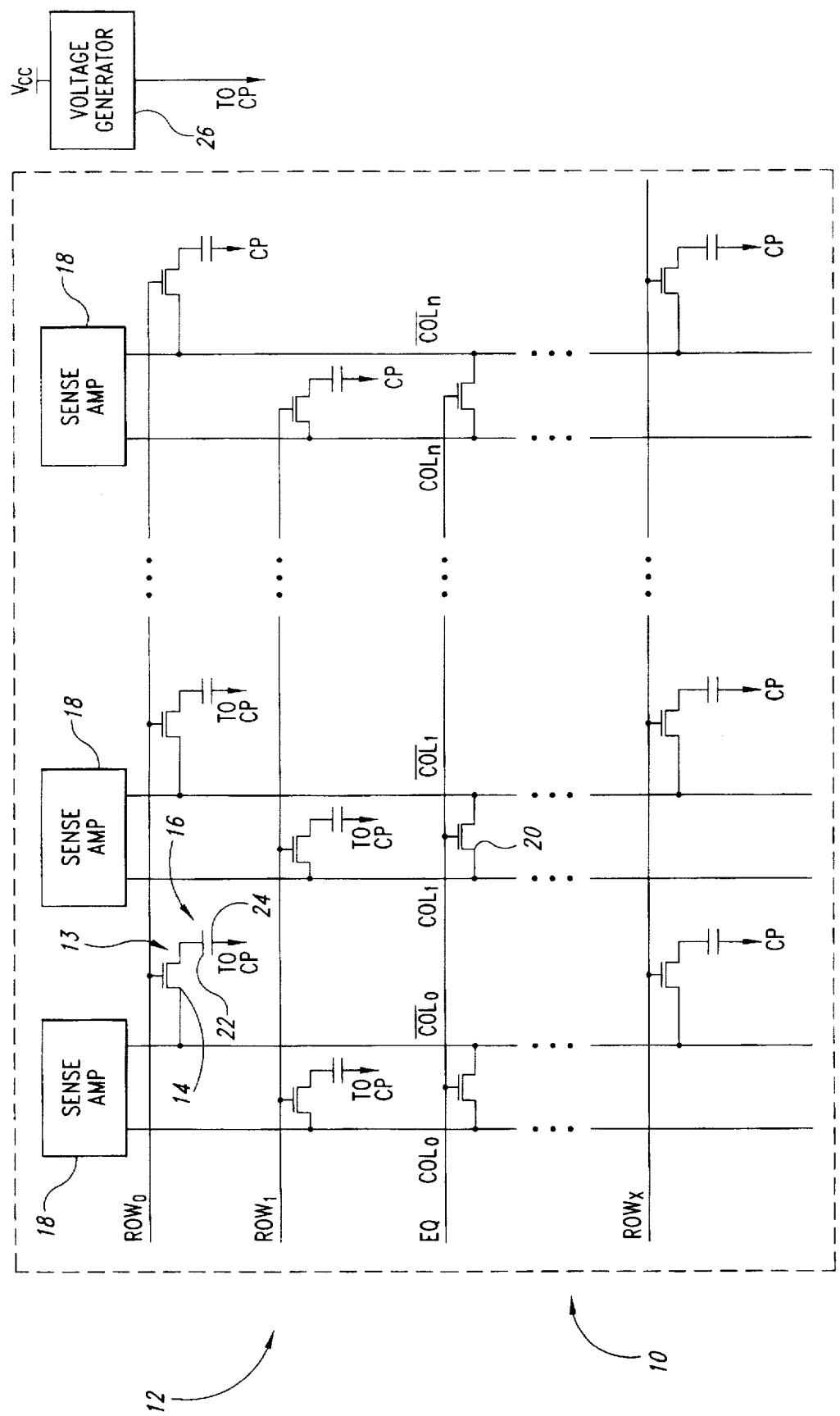
FIG. 1 is a schematic diagram of a memory-cell array of a conventional memory device.
Figure 2:
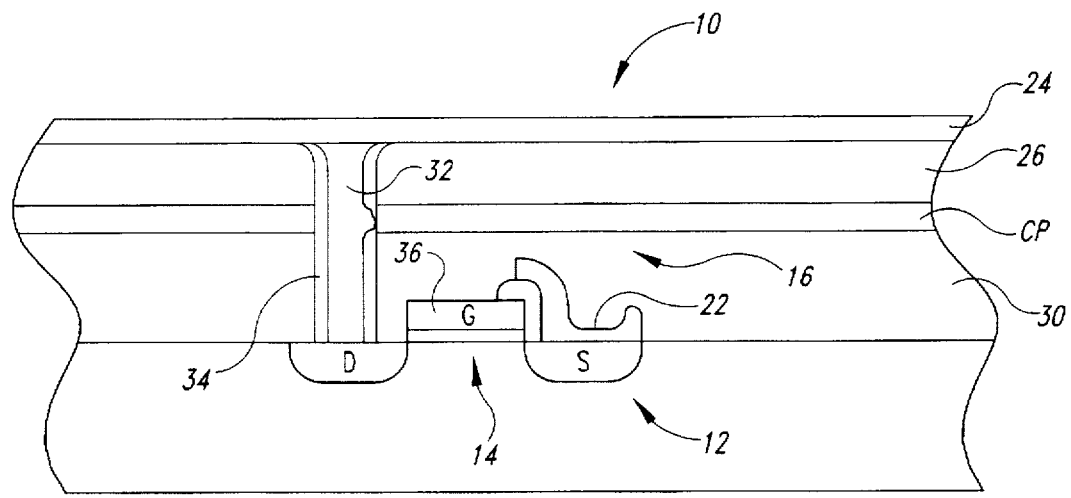
FIG. 2 is a cross sectional view of a portion of the memory-cell array of FIG. 1.

Unlike the array 10 of FIG. 1, however, the array 36 includes a plurality of cell plates $CP_0$–$CP_n$, which are each associated with one or more complimentary pairs of column lines. That is, the storage capacitors 16 of the memory cells 13 that are coupled to the associated column lines are all coupled to the same cell plate CP. For example, as shown, the storage capacitors 16 associated with the column lines COL0, $\overline{COL0}$, COL1, and $\overline{COL1}$ are all coupled to the cell plate $CP_0$. A group of columns that are associated with a particular cell plate CP may also be associated with a group of the same number of redundant columns (not shown in FIG. 3). Although each cell plate CP is shown associated with two complementary pairs of column lines, each cell plate may be associated with fewer or more complementary pairs of column lines.

Each of the individual cell plates $CP_0$–$CP_n$ is coupled to the voltage generator 20 via a respective one of the isolation circuits $38_0$–$38_n$. In one aspect of the invention as shown, each isolation circuit 38 has a control terminal that is coupled to a respective control line $40_0$–$40_n$. The control circuitry 41 generates signals $CONTROL_0$–$CONTROL_n$ on the control lines $40_0$–$40_n$ to control the operation of the isolations circuits 38.

In one aspect of the invention, the cell plates $CP_0$–$Cp_n$ are formed from a single conductive layer as in prior memory devices. However, unlike prior memory devices, isolation trenches (not shown) are conventionally etched to divide the single conductive layer into the plurality of cell plates $CP_0$–$Cp_n$. The isolation trenches are then filled with an insulator material in a conventional manner. Or, the cell plates $CP_0$–$Cp_n$ can be formed in different conductive layers.

In operation, if a short circuit develops between one of the cell plates CP and any other portion of the memory-cell array 36, the isolation circuit 38 associated with the shorted cell plate CP prevents the short circuit from affecting the bias voltage that the voltage generator 20 provides to the other cell plates CP. That is, the isolation circuit 38 prevents the short circuit from pulling up or down the bias voltage on the other non-shorted cell plates CP. By effectively removing from the array 36 the shorted cell plate CP, the array 36, and thus the memory device 42 (not shown in FIG. 4) that contains the array 36, are not rendered irreparably defective. As discussed below in conjunction with FIG. 5, the memory cells 13 associated with the shorted cell plate CP can be replaced with redundant memory cells.

Figures 4A, 4B:
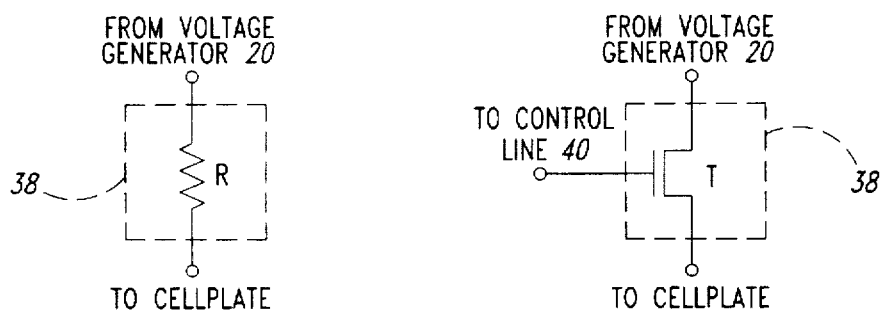
FIGS. 4A and 4B are schematic diagrams of different embodiments of the isolation circuits of FIG. 3.

FIG. 4A illustrates one embodiment of an isolation circuit 38 of FIG. 3. The isolation element 38 includes an impedance, here a resistor R, that has a value sufficient to limit the current drawn through a short-circuited cell plate CP to an amount that will not alter the bias voltage output by the voltage generator 20 (FIG. 3). As shown, if the isolation elements 38 comprise such two-terminal impedances, the control lines $40_0$–$40_n$ (FIG. 3) are unnecessary and may be omitted.

FIG. 4B illustrates another embodiment of an isolation circuit 38 of FIG. 3. The isolation circuit 38 includes a switch, here a field-effect transistor T. The control terminal of the switch, here the gate of the transistor T, is coupled to a respective control line 40 (FIG. 3). If an associated cell plate CP is not short circuited or otherwise defective, the control circuitry (not shown in FIG. 4B), via a corresponding signal CONTROL on the respective control line 40, holds the switch in a closed or conducting state. If the associated cell plate CP is defective, however, the control circuitry holds the switch in an open or nonconducting state to decouple the defective cell plate CP from the voltage generator 20 (FIG. 3).

Although two possible embodiments of the isolation circuits 38 are discussed, it is understood that other circuit elements or circuits may be used for the isolation circuits 38.

Figure 5:
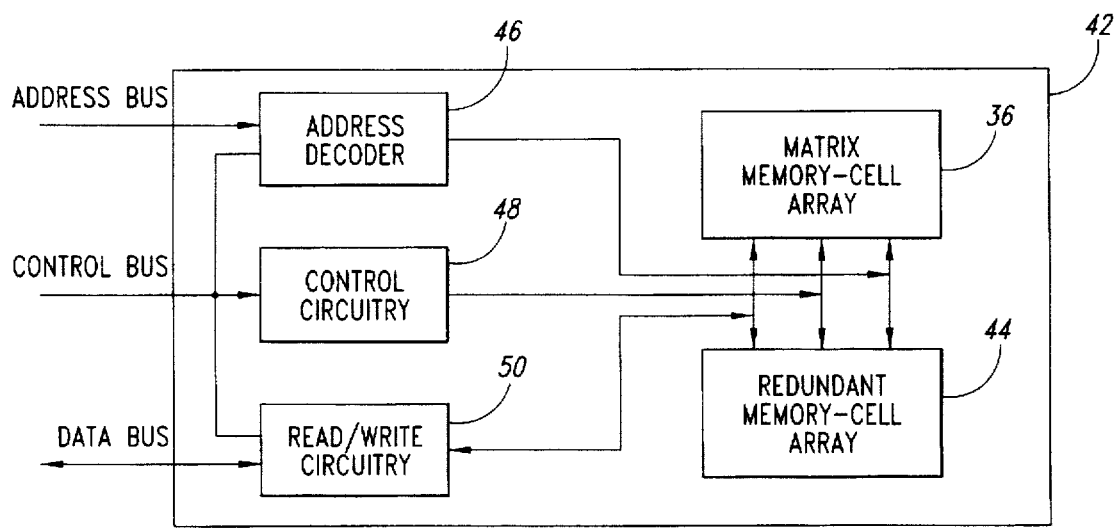
FIG. 5 is a block diagram of a memory device that includes the memory-cell array of FIG. 3.

FIG. 5 is a block diagram of a memory device 42 that includes the memory-cell array 36 of FIG. 3. As shown, the memory device 42 also includes an array 44 of redundant memory cells, an address decoder 46, control circuitry 48, and read/write circuitry 50. As shown, the arrays 36 and 44 are coupled to the address decoder 46, the control circuitry 48, and the read/write circuitry 50. The address decoder 46 is also coupled to an ADDRESS bus and a CONTROL bus. The control circuitry 48 is coupled to the CONTROL bus, and the read/write circuitry 50 is coupled to the CONTROL bus and a DATA bus.

In operation, external circuitry (not shown) provides an address on the ADDRESS bus and control signals on the CONTROL bus during both read and write cycles. During a read cycle, the address is provided to the memory cell array 36 by the address decoder 46, and the control circuitry 48 provides the appropriate control signals such that the array 36 provides to the read/write circuitry 50 data from the addressed memory cell or cells 13 (FIG. 3). The read/write circuitry 50 then places this data onto the DATA bus. During a write cycle, the address decoder 46 and the control circuitry 48 respectively provide the address and control signals to the array 36. The external circuitry also provides the data to be written into the array 36 to the read/write circuitry 50, which provides this data to the array 36. The array 36 then stores this data in the addressed memory cell or cells 13.

In a situation where one or more groups of memory-cell columns of the array 36 are found defective (because of a short-circuited cell plate CP or otherwise), these columns are effectively replaced with substantially identical groups of columns from the redundant array 44. This replacement is typically done in a conventional manner during testing of the memory device 42, by programming the control circuitry 48 to map the selected columns from the redundant array 44 to the addresses of the defective columns in the array 36. Thus, when the external circuitry addresses a memory cell 13 in a defective column, the data is routed to a redundant memory cell in a corresponding replacement column located in the redundant array 44. Such rerouting, however, is transparent to the external circuitry.

Referring to FIG. 3, in one embodiment of the invention, if at least one of a predetermined group of columns is defective, the whole group is replaced with a corresponding group of redundant columns from the redundant array 44. Such a technique allows one to set the maximum number of cell plates CP equal to the number of the predetermined groups of columns in the array 36. Having more than this maximum number of cell plates CP, such that one or more groups of the columns in the array 36 are each associated with multiple cell plates CP, would provide no additional benefit. For example, because defective columns in the array 36 are replaced in groups anyway, if one of the multiple cell plates CP became shorted, all the columns in the group, even those not associated with the shorted cell plate CP, would have to be replaced.

Figure 6:
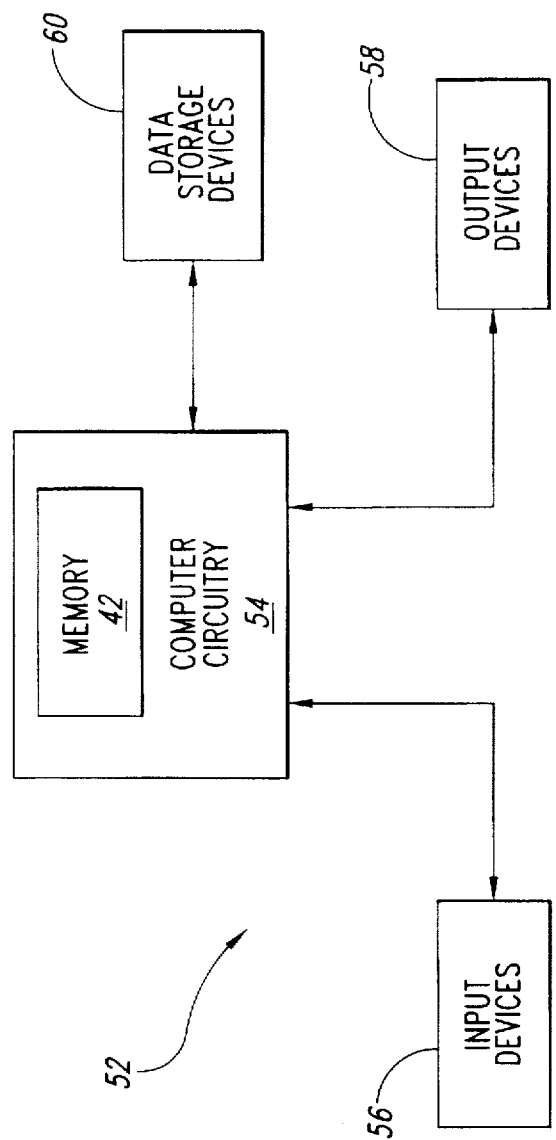
FIG. 6 is a block diagram of a computer system that includes the memory device of FIG. 5.

FIG. 6 is a block diagram of a computer system 52 that uses the memory device 42 of FIG. 5. The computer system 52 includes computer circuitry 54 for performing computer functions, such as executing software to perform desired calculations and tasks. The circuitry 54 typically includes a processor (not shown) and the memory 42 as shown. One or more input devices 56, such as a keypad or a mouse, are coupled to the computer circuitry 54 and allow an operator (not shown) to manually input data thereto. One or more output devices 58 are coupled to the computer circuitry 54 to provide to the operator data generated by the computer circuitry 54. Examples of output devices 58 include a printer and a video display unit. One or more data storage devices 60 are coupled to the computer circuitry 54 to store data on or retrieve data from external storage media (not shown). Examples of the storage devices 60 and corresponding storage media include drives that accept hard and floppy disks, tape cassettes, and compact disk read-only memories (CD-ROMs). Typically, the computer circuitry 54 generates the ADDRESS, $\overline{RAS}$, $\overline{CAS}$, $\overline{WE}$, and $\overline{OE}$ signals as well as other signals. The computer circuitry 54 is coupled to the ADDRESS, DATA, and CONTROL buses of the memory 42 as shown in FIG. 5.

Figure 7:
FIG. 7 is a block diagram of an apparatus for testing the memory device of FIG. 5.

FIG. 7 is a block diagram of a conventional testing apparatus 62 for testing the memory 42. During testing of the memory 42, the testing apparatus 62 can identify defective ones of the cell plates CP (FIG. 3), and can program the control circuitry to generate appropriate control signals such that the corresponding isolation circuits 38 uncouple the defective cell plates CP from the voltage generator 20.

It will be appreciated that, although specific embodiments of the invention have been described herein for purposes of illustration, various modifications may be made without departing from the spirit and scope of the invention. Accordingly, the invention is not limited except as by the appended claims.

I claim:

1. A memory array, comprising:

a plurality of row lines;

a plurality of column lines;

a plurality of conductive cell plates that each correspond to a respective one of said column lines;

a plurality of memory cells that are arranged in rows and columns, each of said memory cells coupled to a respective one of said row lines and to a respective one of said column lines, each of said memory cells including, a capacitor having a first plate and having a second plate coupled to a respective cell plate, said capacitor operable to store a bit of data, and a switch coupled to said row line, said column line, and said first plate, said switch operable to couple said capacitor to said column line in response to a signal on said row line;

a generator that is operable to produce a bias voltage; and a plurality of isolation circuits that are each coupled between said generator and a respective one of said cell plates, each isolation circuit operable to isolate said bias voltage from said respective cell plate when said respective cell plate is coupled to a voltage other than said bias voltage.

2. A memory circuit, comprising:

a plurality of word lines;

a plurality of digit lines;

an array of memory cells that each have a first control terminal coupled to a respective one of said word lines, a data terminal coupled to a respective one of said digit lines, and a reference terminal, each of said memory cells including, a data storage element having a first plate and having a second plate coupled to said reference terminal and a switch having a first signal terminal coupled to said data terminal, a second signal terminal coupled to said first plate, and a second control terminal coupled to said first control terminal;

a plurality of conductive cell plates that are each associated with a respective one or more of said digit lines, each of said cell plates coupled to said reference terminals of all of said memory cells that are coupled to said respective one or more digit lines, said cell plates disposed substantially parallel to said digit lines;

a bias-voltage generator that has an output terminal; and a plurality of isolators that each have an input terminal coupled to said output terminal of said generator and have an output terminal coupled to a respective one of said cell plates.

3. A method for repairing an array of storage cells that are arranged in rows and columns, said array including a plurality of conductive cell plates that are each coupled to a respective one or more of said storage cells, and a generator that is coupled to and that generates a reference voltage on each of said cell plates, said storage cells each including a storage capacitor having a plate coupled to a respective one of said cell plates, the method comprising:

identifying a cell plate hat is coupled to a voltage source other than said generator; and isolating from said generator said identified cell plate.

4. A dynamic random access memory, comprising:

an address bus;

a control bus;

a data bus;

an address decoder coupled to said address bus;

control circuitry coupled to said control bus;

read-write circuitry coupled to said data bus;

redundancy circuitry coupled to said address decoder, said control circuitry, and said read-write circuitry, said redundancy circuitry including one or more columns of redundant cells;

a memory array coupled to said address decoder, said control circuitry, and said read-write circuitry, said array including, a plurality of word lines;

a plurality of bit lines;

an array of memory cells that each have a first control terminal coupled to one of said word lines, a data terminal coupled to one of said bit lines, and a reference terminal, each of said memory cells including, a capacitive element having a first plate and having a second plate coupled to said reference terminal, and a switch having a first signal terminal coupled to said data terminal; a second signal terminal coupled to said first plate, and a second control terminal coupled to said first control terminal;

a plurality of conductive cell plates that are each associated with a respective one or more of said bit lines, each of said cell plates coupled to said reference terminals of all of said memory cells that are coupled to said respective one or more bit lines said cell plates positioned substantially parallel to said bit lines;

a bias-voltage generator that has an output terminal; and a plurality of isolators that each have an input terminal coupled to said output terminal of said generator and have an output terminal coupled to a respective one of said cell plates.

5. A computer system, comprising;

a data input device;

a data output device;

an address bus;

a data bus;

a control bus;

computing circuitry coupled to said data input and output devices, and said data, address, and control busses, said computing circuitry including a memory device that includes a memory array coupled to said address bus, said control bus and said data bus, said array including, a plurality of word lines;

a plurality of digit lines;

an array of memory cells that each have a first control terminal coupled to one of said word lines, a data terminal coupled to one of said digit lines, and a reference terminal, each of said memory cells including, a capacitive element having a first plate and having a second plate coupled to said reference terminal, and a switch having a first signal terminal coupled to said data terminal, a second signal terminal coupled to said first plate, and a second control terminal coupled to said first control terminal;

a plurality of conductive cell plates that are each associated with a respective one or more of said digit lines, each of said cell plates coupled to said reference terminals of all of said memory cells that are coupled to said respective one or more digit lines, said cell plates disposed substantially in parallel to said digit lines;

a bias-voltage generator that has an output terminal; and a plurality of isolators that each have an input terminal coupled to said output terminal of said generator and have an output terminal coupled to a respective one of said cell plates.

6. The array of claim 1 wherein each of said isolation circuits comprises a respective resistor coupled between said generator and said respective cell plate.

7. The memory circuit of claim 2 wherein each of said isolators comprises a respective resistor coupled between said input and output terminals of said each isolator.

8. The array of claim 1 wherein each of said cell plates is coupled to a plurality of said memory cells from a plurality of said columns.

9. The array of claim 1 wherein said generator is coupled to receive a supply voltage and operable to generate said bias voltage approximately equal to one half of said supply voltage.

10. The array of claim 1 wherein each of said isolation circuits is operable to isolate said bias voltage from said respective cell plate in response to a control signal.

11. The memory circuit of claim 2 wherein each of said cell plates is associated with a respective group of multiple ones of said lines, said each cell plate coupled to said reference terminals of all of said memory cells that are coupled to a respective digit line within said respective group.

12. The memory circuit of claim 11 wherein said digit lines of said group are adjacent to one another.

13. The memory circuit of claim 2 wherein said generator has a supply terminal and is operable to produce on said output terminal a bias voltage that is approximately equal to one half of a voltage that is coupled to said supply terminal.

14. The memory circuit of claim 2, further comprising:

a plurality of isolator control lines; and each of said isolators including, a second control terminal that is coupled to a respective one of said isolator control lines, and a switch that has a third control terminal coupled to said second control terminal, a first signal terminal coupled to said input terminal of said isolator, and a second signal terminal coupled to said output terminal of said isolator.

15. The method of claim 3 wherein said isolating comprises uncoupling said generator from said identified cell plate.

16. The method of claim 3 wherein said isolating comprises limiting a current that flows between said generator and said identified cell plate.

17. The method of claim 3 wherein said identifying comprises identifying a short-circuited cell plate.

18. The dynamic random access memory of claim 4 wherein said bit lines are arranged in array sets of multiple bit lines, and wherein each of said cell plates is associated with a different one of said sets and is coupled to all of said memory cells that are coupled to respective bit lines within said associated set.

19. The dynamic random access memory of claim 18 wherein each of said sets includes four of said bit lines.

20. The dynamic random access memory of claim 18 wherein said columns of redundant cells are arranged in redundant sets that each include the same number of bit lines as there are in one of said array sets.

21. The dynamic random access memory of claim 18 wherein each of said array sets includes at least two adjacent bit lines.

22. The dynamic random access memory circuit of claim 4. further comprising:

a plurality of control lines; and each of said isolators including, a second control terminal that is coupled to a respective one of said control lines, and a switch that has a third control terminal coupled to said second control terminal, a first signal terminal coupled to said input terminal of said each isolator, and a second signal terminal coupled to said output terminal of said each isolator.

23. The computer system of claim 5 wherein each of said cell plates corresponds to a group of a plurality of said digit lines, each of said cell plates coupled to said reference terminal of every memory cell that has its data terminal coupled to a respective digit line within said respective group.

24. The computer system of claim 23 wherein said digit lines of said group are adjacent to one another.

25. The computer system of claim 5 wherein said generator has a supply terminal and is operable to produce at said output terminal a bias voltage that is approximately equal to one half of a voltage that is coupled to said supply terminal.

26. The computer system of claim 5 wherein said memory device further comprises:

an isolation circuit;

a plurality of isolator control lines each coupled to said isolation circuit and each associated with a respective one of said isolators; and each of said isolators including, a second control terminal that is coupled to a respective one of said isolator control lines, and a switch that has a third control terminal coupled to said second control terminal, a first signal terminal coupled to said input terminal of said isolator, and a second signal terminal coupled to said output terminal of said isolator.

* * * * *

UNITED STATES PATENT AND TRADEMARK OFFICE
CERTIFICATE OF CORRECTION

PATENT NO. : 5,787,044
DATED : July 28, 1998
INVENTOR(S) : Kevin G. Duesman

It is certified that error appears in the above-identified patent and that said Letters Patent is hereby corrected as shown below:

Column 7,
Line 35, "a cell plate hat is" should read -- a cell plate that is --.

Column 8,
Line 24, "control bus and said" should read -- control bus, and said --.

Column 9,
Line 3, "ones of said lines" should read -- ones of said digit lines --.

Column 10,
Line 16, "corresponds to a group" should read -- corresponds to a respective group --.

Signed and Sealed this

Eighth Day of January, 2002

*Attest:*

JAMES E. ROGAN
*Attesting Officer*     *Director of the United States Patent and Trademark Office*